(12) United States Patent
Chan et al.

(10) Patent No.: US 8,837,235 B1
(45) Date of Patent: Sep. 16, 2014

(54) LOCAL EVALUATION CIRCUIT FOR STATIC RANDOM-ACCESS MEMORY

(71) Applicant: International Buisness Machines Corporation, Armonk, NY (US)

(72) Inventors: Yuen Hung Chan, Poughkeepsie, NY (US); Michael Kugel, Boeblingen (DE); Silke Penth, Holzgerlingen (DE); Tobias Werner, Schoenbuch (DE)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/786,860

(22) Filed: Mar. 6, 2013

(51) Int. Cl.
  *G11C 7/00* (2006.01)
  *G11C 5/06* (2006.01)
  *G11C 5/02* (2006.01)
  *G11C 7/08* (2006.01)
  *G11C 7/12* (2006.01)
  G11C 11/4096 (2006.01)
  G11C 7/10 (2006.01)

(52) U.S. Cl.
  CPC .. *G11C 7/12* (2013.01); *G11C 7/00* (2013.01); G11C 11/4096 (2013.01); G11C 7/10 (2013.01)
  USPC .................. 365/189.15; 365/189.08; 365/51; 365/63

(58) Field of Classification Search
  CPC ........ G11C 7/00; G11C 7/12; G11C 11/4096; G11C 5/06; G11C 7/10
  USPC ............................ 365/189.15, 189.08, 63, 51
  See application file for complete search history.

(56) References Cited

U.S. PATENT DOCUMENTS

| | | | |
|---|---|---|---|
| 6,944,582 | B2 | 9/2005 | Becker |
| 7,668,024 | B2 | 2/2010 | Chang et al. |
| 7,724,585 | B2 | 5/2010 | Behrends et al. |
| 7,813,163 | B2 | 10/2010 | Pille et al. |
| 2008/0298137 | A1 | 12/2008 | Chan et al. |
| 2012/0155188 | A1 | 6/2012 | Buettner |

OTHER PUBLICATIONS

Pille et al., Implementation of the CELL Broadband Engine in a 65nm SOI Technology Featuring Dual-Supply SRAM Arrays Supporting 6GHz at 1.3V, Solid-State Circuits Conference, 2007, ISSCC 2007, Digest of Technical Papers, IEEE International, pp. 322-606.
Singhal et al., Comparative Study of Power Reduction Techniques for Static Random Access Memory, International Journal of VLSI and Signal Processing Applications, Jan. 2011, pp. 80-88.

*Primary Examiner* — Ly D Pham
(74) *Attorney, Agent, or Firm* — Yudell Isidore Ng Russell PLLC; Matthew Baca

(57) ABSTRACT

A local evaluation circuit for a memory array includes first and second NAND gates and first, second, third, and fourth switches. The first switch is configured to couple a first node of the second NAND gate to a first power supply node in response to a first read signal. The second switch is configured to couple a first node of the first NAND gate to the first power supply node in response to a second read signal. The third switch is configured to couple a second node of the first NAND gate to a second power supply node in response to the first read signal. The fourth switch is configured to couple a second node of the second NAND gate to the second power supply node in response to the second read signal.

20 Claims, 8 Drawing Sheets

LOCAL EVALUATION CIRCUIT FOR STATIC RANDOM-ACCESS MEMORY

BACKGROUND

The disclosure generally relates to static random-access memory and, in particular, a local evaluation circuit for a static random-access memory.

Static random-access memory (SRAM) is a type of semiconductor memory that uses bistable latching circuitry to store each bit. The term static differentiates SRAM from dynamic random-access memory (DRAM), which must be periodically refreshed. SRAM exhibits data remanence, but is still volatile in the conventional sense that data is eventually lost when the SRAM is not powered. Typically, each bit in an SRAM is stored on four transistors that form a storage cell having two cross-coupled inverters. The storage cell has two stable states that are denoted '0' and '1'. Usually, two additional access transistors serve to control access to the storage cell during read and/or write operations. In general, an SRAM utilizes six metal-oxide semiconductor field-effect transistors (MOSFETs) to store each memory bit. Other types of SRAM chips may use eight or more transistors per bit to facilitate the implementation of more than one port (i.e., read and/or write ports) for use in certain types of video memory and register files.

Generally, the fewer and smaller sized transistors implemented per cell, the smaller each cell can be. Since the cost of processing a silicon wafer is relatively fixed, using smaller cells and packing more bits on a wafer usually reduces the cost per bit of memory. Access to a typical SRAM cell is facilitated by one or more wordlines that control two access transistors which, in turn, control whether the cell is coupled to one or more bitlines. The wordlines are used to access a cell for both read and write operations. Although it is not strictly necessary to have two bitlines (bitline true (BLT) and bitline complement (BLC)) to read a cell, a data signal and its inverse are typically provided during a read in order to improve noise margins. During read accesses, the bitlines are actively driven high and low by inverters in the SRAM cell. This usually improves SRAM bandwidth, as compared to DRAMs, i.e., in a DRAM a bitline is connected to storage capacitors and charge sharing causes the bitline to swing upwards or downwards.

The symmetric structure of SRAMs also allows for differential signaling, which makes small voltage swings more easily detectable. Another difference between SRAM and DRAM that contributes to making SRAM faster is that SRAM chips typically accept all address bits at a single time. In contrast, DRAMs typically employ address multiplexing with higher address bits followed by lower address bits over the same package pins in order to reduce DRAM size and cost. An SRAM cell has three different states: standby, reading, and writing. In a standby state an SRAM is idle. In a reading state data has been requested from the SRAM. In a writing state, contents of the SRAM are updated. If wordlines are not asserted, access transistors disconnect an SRAM cell from bitlines. In this case, the two cross-coupled inverters continue to reinforce each other as long as they are connected to a power supply.

Assuming that the content of a cell is a '1', i.e., BLT is a '1', a read cycle is started by precharging both bitlines (BLT and BLC) to a logical '1', then asserting the wordline or lines to enable both of the access transistors. The stored values are transferred to the bitlines with BLT being left at its precharged value and BLC discharging to a logical '0'. If the content of the memory was a '0', the opposite would happen and BLC would be pulled toward '1' and BLT toward '0'. A sense amplifier senses a small voltage difference between BLT and BLC to determine whether a '1' or '0' was stored on the cell. The start of a write cycle begins by applying the value to be written to the bitlines. To write a logical zero '0' to an SRAM cell, a logical zero '0' is applied to bitline BLT and a logical one '1' is applied to bitline BLC. A logical one '1' is written to the SRAM cell by inverting the values on the bitlines BLT and BLC. The wordlines (i.e., wordline true (WLT) and wordline complement (WLC)) are then asserted and the value that is to be stored is latched in the SRAM cell. It should be appreciated that the bitline input drivers are designed to be stronger than the relatively weak transistors in the SRAM cell so that the bitline drivers can easily override the previous state of the cross-coupled inverters. In general, correct sizing of the transistors in an SRAM cell is required to ensure proper operation.

High-speed memory design has become increasingly important to the overall performance of processors and data processing systems. In general, bitline sensing is one of the largest contributors to memory latency. For a cache memory, for example, bitline sensing can account for as much as two-thirds of total cache latency.

BRIEF SUMMARY

A local evaluation circuit for a memory array includes a first NAND gate and a second NAND gate. The first NAND gate includes a first input, a second input, and an output. A first local bit line of a first column of the memory array is coupled to the first input of the first NAND gate, a second local bit line of the first column is coupled to the second input of the first NAND gate, and the output of the first NAND gate is coupled to a global bit line. The first column of the memory array includes a plurality of memory cells and the first and second local bit lines are coupled to different clusters of the memory cells in the first column. The second NAND gate includes a first input, a second input, and an output. A third local bit line of a second column of the memory array is coupled to the first input of the second NAND gate, a fourth local bit line of the second column is coupled to the second input of the second NAND gate, and the output of the second NAND gate is coupled to the global bit line. The second column of the memory array includes a plurality of memory cells and the third and fourth local bit lines are coupled to different clusters of the memory cells in the second column.

A first switch is configured to couple a first node of the second NAND gate to a first power supply node in response to a first read signal. A second switch is configured to couple a first node of the first NAND gate to the first power supply node in response to a second read signal. A third switch is configured to couple a second node of the first NAND gate to a second power supply node in response to the first read signal. A fourth switch is configured to couple a second node of the second NAND gate to the second power supply node in response to the second read signal.

The above summary contains simplifications, generalizations and omissions of detail and is not intended as a comprehensive description of the claimed subject matter but, rather, is intended to provide a brief overview of some of the functionality associated therewith. Other systems, methods, functionality, features and advantages of the claimed subject matter will be or will become apparent to one with skill in the art upon examination of the following figures and detailed written description.

The above as well as additional objectives, features, and advantages of the present invention will become apparent in the following detailed written description.

BRIEF DESCRIPTION OF THE DRAWINGS

The description of the illustrative embodiments is to be read in conjunction with the accompanying drawings, wherein.

DETAILED DESCRIPTION

The illustrative embodiments provide an evaluation circuit for a static random-access memory (SRAM).

In the following detailed description of exemplary embodiments of the invention, specific exemplary embodiments in which the invention may be practiced are described in sufficient detail to enable those skilled in the art to practice the invention, and it is to be understood that other embodiments may be utilized and that logical, architectural, programmatic, mechanical, electrical and other changes may be made without departing from the spirit or scope of the present invention. The following detailed description is, therefore, not to be taken in a limiting sense, and the scope of the present invention is defined by the appended claims and equivalents thereof.

It is understood that the use of specific component, device, and/or parameter names are for example only and not meant to imply any limitations on the invention. The invention may thus be implemented with different nomenclature/terminology utilized to describe the components/devices/parameters herein, without limitation. Each term utilized herein is to be given its broadest interpretation given the context in which that term is utilized.

Figure 1:
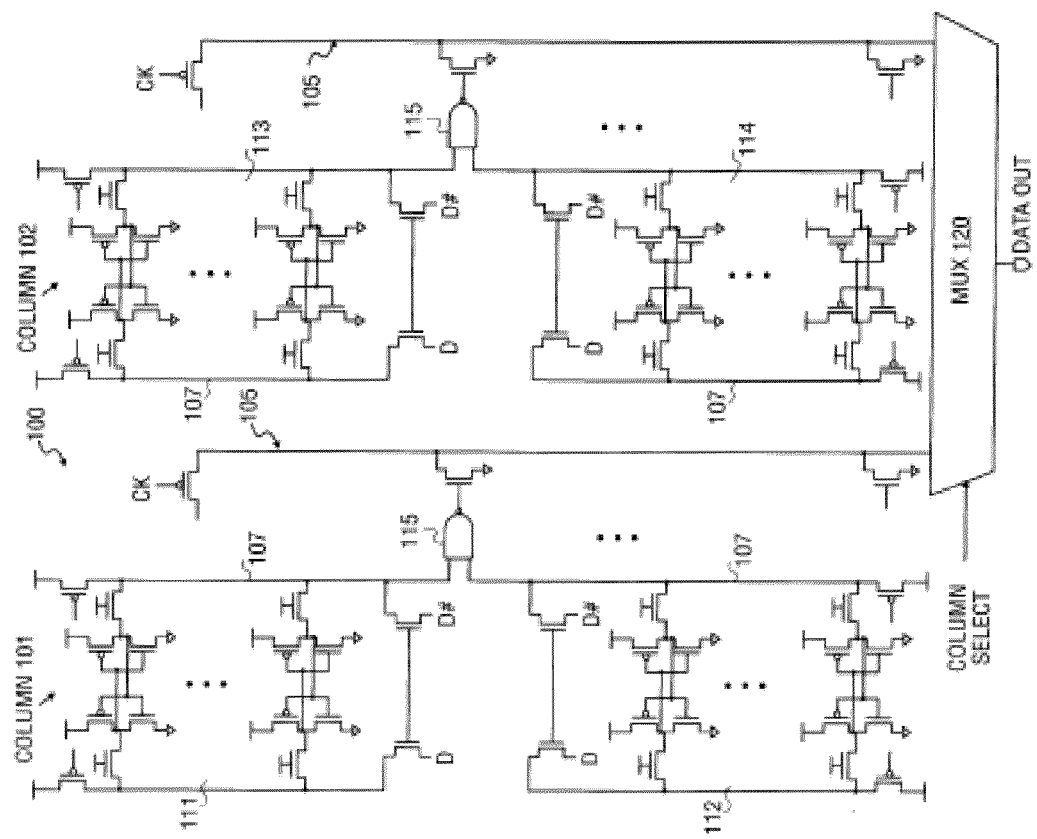
FIG. 1 is a diagram of relevant portion of a memory that includes a conventional local evaluation circuit configured to perform bitline sensing.

With reference to FIG. 1, U.S. Pat. No. 6,292,401 (hereinafter "the '401 patent") discloses a conventional memory 100 that provides a respective global bitline 105 for each column 101 and 102 of memory cells. In memory 100, local bitlines 107 are coupled to clusters of memory cells 111-114. In operation, in response to a read request, local bitlines 107 coupled to a memory row to be read indicate a logical value stored in a corresponding memory cell. If any local bitline 107 coupled to a global bitline indicates a logical zero value, a corresponding global bitline 105 is pulled down (through NAND gate 115). Thus, in conventional memory 100, multiple global bitlines 105 are switched in response to a memory read request if more than one memory cell in the row being read stores a logical zero value. In response to a column select signal, a multiplexer 120 selects between signals communicated over global bitlines 105 and outputs the selected data. In conventional memory 100, because global bitlines may be switched even when a corresponding column is not selected to be read, power consumption of memory 100 may be undesirably high.

Figure 2:
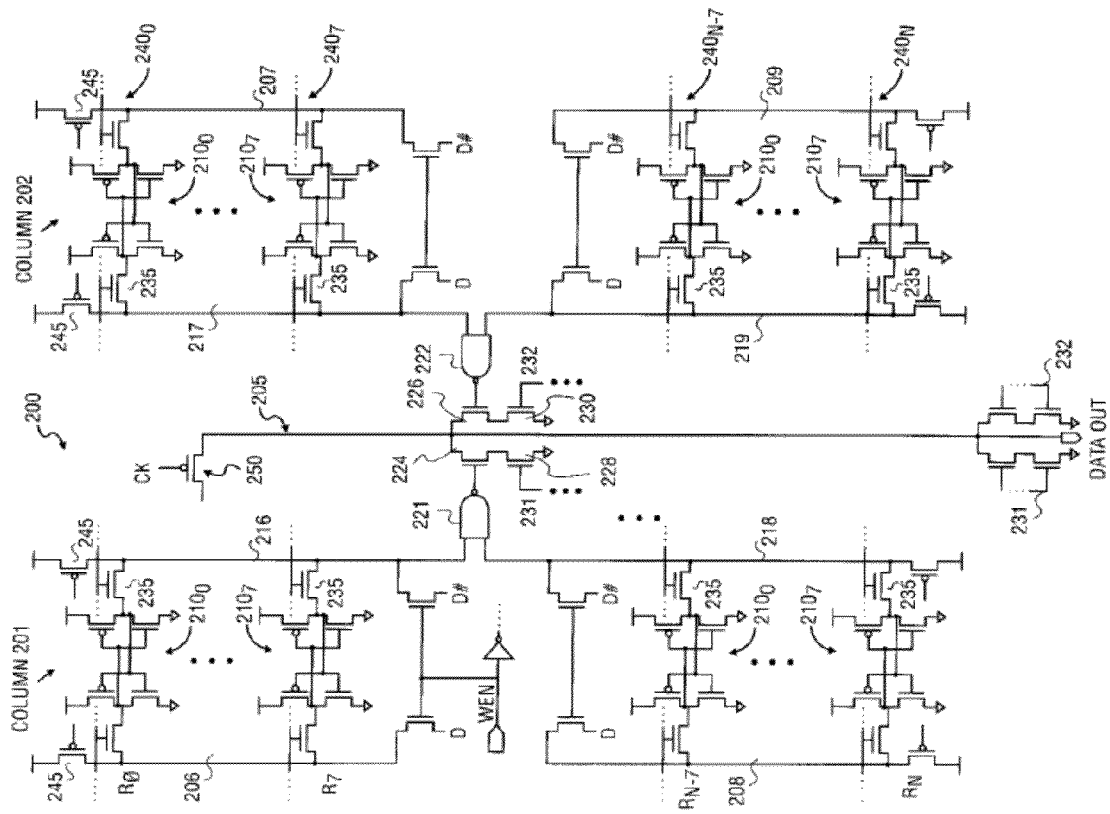
FIG. 2 is a diagram of relevant portion of a memory that includes another conventional local evaluation circuit that is configured to perform bitline sensing.

To address the problem of global bitlines of a memory being switched even when a corresponding column is not selected to be read, the '401 patent proposes a memory having a global bitline that is shared by at least two columns of memory cells. During a memory read operation, the shared global bitline is switched responsive to data stored in one or more of the columns of memory being read. With reference to FIG. 2 a memory 200 is illustrated that includes a global bitline 205 that is shared by two adjacent columns 201 and 202 of memory cells. Within columns 201 and 202, the memory cells of the memory 200 are further grouped in clusters 206-209. Each cluster 206-209 is coupled to a corresponding local bitline 216-219, respectively. Each cluster 206-209 may also be coupled to a complementary local bitline, with both true and complementary local bitlines available for use during a memory write operation. Local bitlines 216 and 218 are coupled to different inputs of a NAND gate 221 and local bitlines 217 and 219 are coupled to different inputs of a NAND gate 222.

An output of NAND gate 221 is coupled to a gate of a data transistor 224 and an output of NAND gate 222 is coupled to a gate of a data transistor 226. For each set of two clusters of memory cells, the pull-down path for global bitline 205 also includes a column select transistor coupled in series with a corresponding data transistor. For clusters 206 and 208, a column select transistor 228 is coupled in series with data transistor 224. For clusters 207 and 209, a column select transistor 230 is coupled in series with data transistor 226. Each of column select transistors 228 and 230 has one terminal coupled to ground and a gate coupled to receive a column select signal over a corresponding column select line 231 and 232. The column select signal received over column select line 231 is a complement of the column select signal received over the column select line 232.

In addition to columns, memory 200 is also arranged in rows, i.e., rows $R_0$ through $R_N$. As one example, memory cell $210_0$ in cluster 206 and memory cell $210_0$ in cluster 207 are both in row $R_0$. Each row of memory cells is coupled to a corresponding row select line 240 (shown as select lines $240_0$ through $240_N$), which may alternately be referred to as a wordline. In operation, prior to a memory read or write operation, local bitlines 216-219 may be precharged high by precharge devices 245 in response to a precharge signal. Global bitline 205 is also precharged high by global bitline precharge devices, similar to global bitline precharge device 250 in response to, for example, a clock signal (CK) going low. Then, in response to a memory read request, a selected row of memory cells is activated to be read by a row select signal received over one of wordlines 240. The row select signal may be generated by row decoding logic in response to a read request that includes an address of memory cell(s) to be read.

The row select signal is received at a gate of a row select transistor 235, for each memory cell in the row to be read. Assuming that the selected row is the row including the memory cells $210_7$ in clusters 206 and 207, the row select signal is communicated over wordline $240_7$. In response, each of the memory cells in the selected row $R_7$ communicates a value stored in the memory cell to a local bitline coupled to the memory cell. For example, if memory cell $210_7$ in cluster 206 stores a logical zero and memory cell $210_7$ in cluster 207 stores a logical one, local bitline 216 is pulled low while local bitline 217 remains high. In this case, one input to NAND gate 221 is low such that an output of NAND gate 221 is high and data transistor 224 is enabled. As both inputs to NAND gate 222 remain high, an output of NAND gate 222 remains low and data transistor 226 is not enabled.

If instead, however, memory cell $210_7$ in cluster 206 and memory cell $210_7$ in cluster 207 both store a logical zero, both of local bitlines 216 and 217 are pulled low. In this case, one input to NAND gate 221 is then low such that an output of NAND gate 221 is high and data transistor 224 is enabled and one input to NAND gate 222 is also low such that an output of NAND gate 222 is also high and the data transistor 226 is also enabled. Assuming memory cell $210_7$ in cluster 206 is to be read, column select transistor 228 is enabled in response to receiving a column select signal. In this case, column select transistor 230 is not enabled because column select signal 232 at a gate of column select transistor 230 is a complement of column select signal 231 at a gate of column select transistor 228. Enabling column select transistor 228 in conjunction with data transistor 224 being enabled and the clock (CK) signal being high during a read operation causes global bitline 205 to be pulled down (switched). In this manner, global bitline 205 is responsive to data stored in the memory cell(s) being read.

A column select signal may be generated by column decode logic in response to a memory read request and a corresponding address. Column select transistors 228 and 230 effectively perform the two-to-one multiplexing function of multiplexer 120 of FIG. 1. Column select transistors 228 and 230 facilitate two columns of memory sharing a single global bitline. In this manner, the number of metal tracks for global bitlines is cut in half, as compared to the memory 100 of FIG. 1, which can be advantageous for a number of reasons. For a memory array, the cell width is typically fixed and, as such, the number of metal tracks that can be run over a cell is limited by the cell width. By reducing the number of global bitline tracks, it may be possible to increase a signal bandwidth in a memory design due to the extra space available. For a multi-ported memory, the advantage may be even more significant. Further, the ability to use only one global bitline for two columns of memory may save power.

In the memory 100 of FIG. 1, all of the global bitlines 105 in the memory 100 may be switched in response to a memory read request with the desired signal(s) being selected by the multiplexer 120 (and possibly other levels of multiplexing) after the global bitlines are activated. In the embodiment of FIG. 2, however, only one global bitline may be activated for every two columns of memory because the 2:1 column multiplexing operation is performed by the column select transistors earlier, before signals propagate through the global bitlines. Additionally, in accordance with the memory structure shown in FIG. 2, column select signals may be combined with write enable signals to prevent local bitline switching during a write operation from propagating to the global bitlines. For the prior memory shown in FIG. 1, such a combination is not straightforward. Because the column select signal is provided as an input to the multiplexer 120, even if a write enable signal and column select signal were to be logically combined, such a combination would not prevent global bitlines 105 from switching in response to local bitline switching during a memory write operation. Unnecessary switching of global bitlines 105 can undesirably increase power consumption of memory 100.

Figure 3:
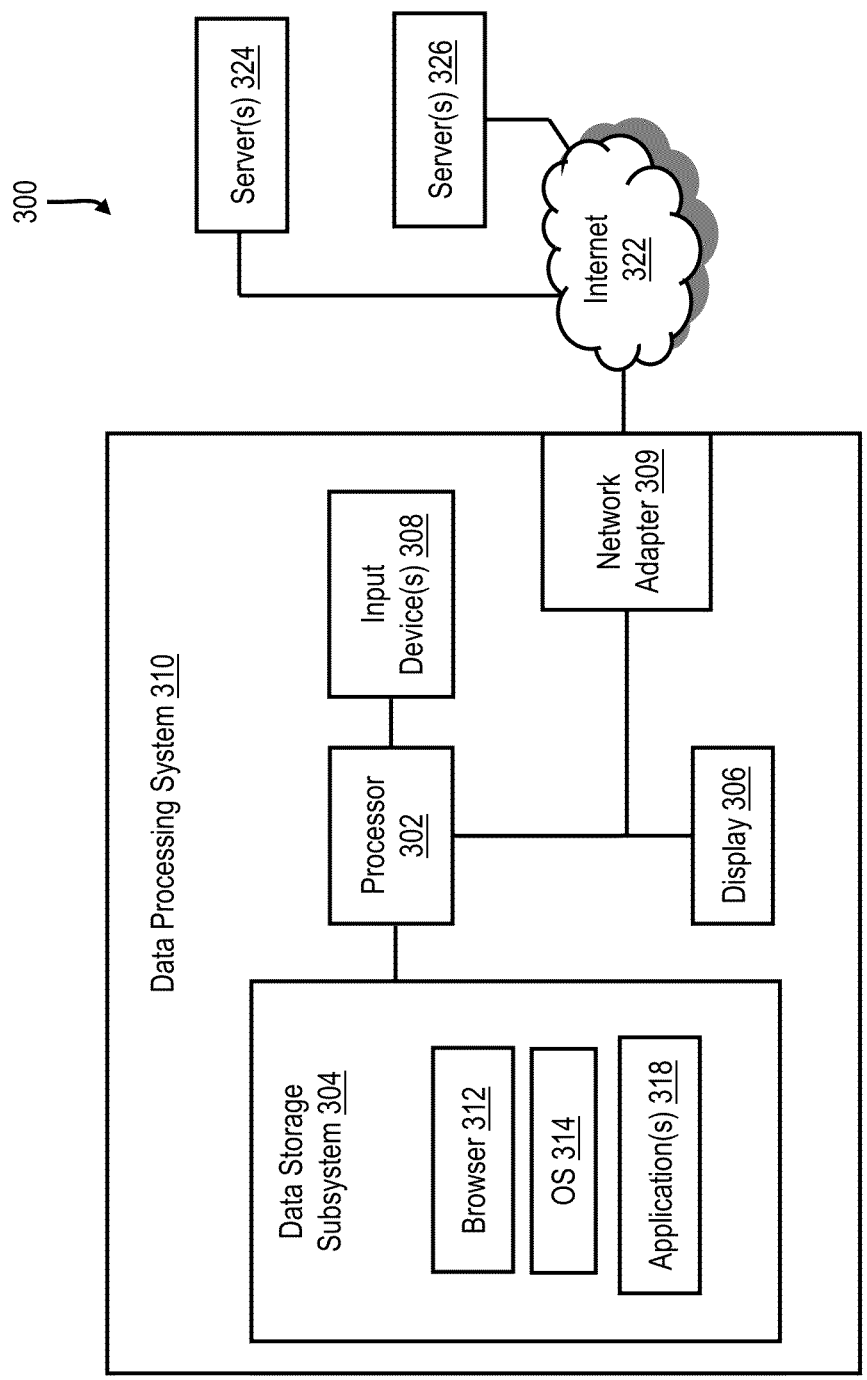
FIG. 3 is a diagram of a relevant portion of an exemplary data processing system environment that includes a data processing system that includes a local evaluation circuit for a static random-access memory (SRAM) that is configured, in accordance with various embodiments of the present disclosure, to perform bitline sensing.

With reference to FIG. 3, an exemplary data processing environment 300 is illustrated that includes a data processing system 310 that is configured to select bitlines of a static random-access memory (SRAM) according to one or more embodiments of the present disclosure. Data processing system 310 may take various forms, such as workstations, laptop computer systems, notebook computer systems, or desktop computer systems and/or clusters thereof. Data processing system 310 includes a processor 302 (which may include one or more processor cores for executing program code) coupled to a data storage subsystem 304, a display 306, one or more input devices 308, and a network adapter 309. Data storage subsystem 304 may include, for example, application appropriate amounts of various memories (e.g., dynamic random access memory (DRAM), SRAM, and read-only memory (ROM)), and/or one or more mass storage devices, such as magnetic or optical disk drives. Processor 302 may also include one or more cache memory levels that implement SRAM that include local evaluation circuits configured to select bitlines according to the present disclosure.

Data storage subsystem 304 includes an operating system (OS) 314 for data processing system 310. Data storage subsystem 304 also includes application programs, such as a browser 312 (which may optionally include customized plug-ins to support various client applications), and other applications (e.g., a word processing application, a presentation application, and an email application) 318.

Display 306 may be, for example, a cathode ray tube (CRT) or a liquid crystal display (LCD). Input device(s) 308 of data processing system 310 may include, for example, a mouse, a keyboard, haptic devices, and/or a touch screen. Network adapter 309 supports communication of data processing system 310 with one or more wired and/or wireless networks utilizing one or more communication protocols, such as 802.x, HTTP, simple mail transfer protocol (SMTP), etc. Data processing system 310 is shown coupled via one or more wired or wireless networks, such as the Internet 322, to various file servers 324 and various web page servers 326 that provide information of interest to the user of data processing system 310.

Those of ordinary skill in the art will appreciate that the hardware components and basic configuration depicted in FIG. 3 may vary. The illustrative components within data processing system 310 are not intended to be exhaustive, but rather are representative to highlight components that may be utilized to implement the present invention. For example, other devices/components may be used in addition to or in place of the hardware depicted. The depicted example is not meant to imply architectural or other limitations with respect to the presently described embodiments.

Figure 4:
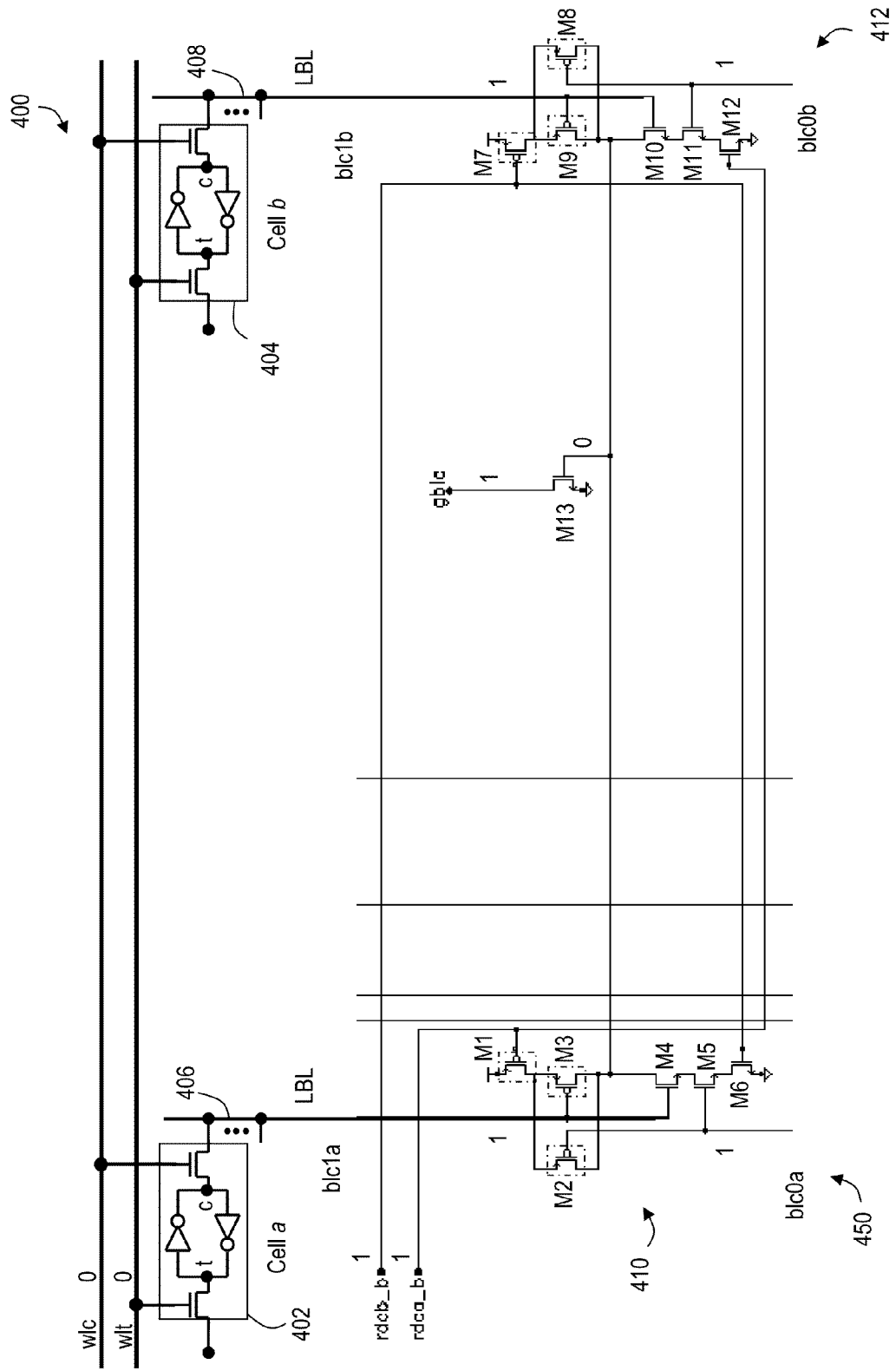
FIG. 4 is a diagram of a relevant portion of a local evaluation circuit that is in a read standby state and is configured in accordance with an embodiment of the present disclosure to perform bitline sensing.

With reference to FIG. 4 a relevant portion of a memory 400 is illustrated that includes multiple memory cells 402 and 404 (respectively, labeled 'Cell a' and 'Cell b') in row '1' of memory 400 and a read portion of a local evaluation circuit 450, which includes transistors (switches) M1-M13 coupled as is illustrated. For brevity, only a complementary side of cells 402 and 404 are discussed in conjunction with FIGS. 4-6. It should be appreciated that a true side of cells 402 and 404 is coupled to similar circuitry (not shown) in a manner similar to the complementary side of cells 402 and 404. Memory cells 402 and 404 are located in a different columns (i.e., column 'a' and 'b', respectively of a same row (i.e., row '1')) of memory 400 and are coupled to respective local bitlines based on signals on true and complementary wordlines (respectively, labeled "wlt" and "wlc"). That is, an asserted signal on complementary wordline 'wlc' couples a complementary side 'c' of cell 402 to complementary local bitline 406 and a complementary side 'c' of cell 404 to complementary local bitline 408. Similarly, an asserted signal on wordline 'wlt' couples a true T side of cell 402 to a true local bitline (not shown) and a true 't' side of cell 404 to another true local bitline (not shown). While only two columns (i.e., columns 'a' and 'b') are illustrated in memory 400, it should be appreciated that a memory configured according to the present disclosure may include more than two columns.

As is shown, memory cell 402 is coupled to local bitline 406 (labeled 'blc1a') and memory cell 404 is coupled to local bitline 408 (labeled 'blc1b'). It should be appreciated that local bitline 406 may be coupled to multiple memory cells (e.g., sixteen memory cells) of a first cluster in different rows of a same column (i.e., column 'a') as cell 402. Similarly, local bitline 408 may be coupled to multiple memory cells (e.g., sixteen memory cells) of a second cluster in different rows of a same column (i.e., column 'b') as cell 404.

Local bitline 406 is coupled to a first input of a first NAND gate 410 (which includes metal-oxide semiconductor field-effect transistors (MOSFETs), i.e., transistors M2-M5). As is shown, transistors M2 and M3 are p-channel MOSFETs, and transistors M4 and M5 are re-channel MOSFETs. A second input of NAND gate 410 is coupled to another local bitline (labeled 'blc0a') that is coupled to another cluster of cells (not shown) in column 'a' of memory 400. As is also illustrated, a transistor M6 is coupled between a first node of NAND gate 410 and VSS, and a transistor M1 is coupled between a second node of NAND gate 410 and VDD. Transistor M1, which is illustrated as a p-channel MOSFET, is responsive to a first read signal (rdca_b). That is, when the first read signal is at a low level transistor M1 turns on, and when the first read signal is at a high level transistor M1 turns off. Transistor M6, which is illustrated as an n-channel MOSFET, is responsive to a second read signal (rdcb_b). That is, when the second read signal is at a high level transistor M6 turns on, and when the second read signal is at a low level transistor M6 turns off.

Local bitline 408 is coupled to a first input of a second NAND gate 412 (which includes metal-oxide semiconductor field-effect transistors (MOSFETs) M8-M11). As is shown, transistors M8 and M9 are p-channel MOSFETs, and transistors M10 and M11 are n-channel MOSFETs. A second input of NAND gate 412 is coupled to another local bitline (labeled 'blc0b') that is coupled to another cluster of cells (not shown) in column 'b' of memory 400. As is also illustrated, a transistor M12 is coupled between a first node of NAND gate 412 and VSS, and a transistor M7 is coupled between a second node of NAND gate 412 and VDD. Transistor M7, which is illustrated as a p-channel MOSFET, is responsive to the second read signal (rdcb_b). That is, when the second read signal is at a low level transistor M7 turns on, and when the second read signal is at a high level transistor M7 turns off. Transistor M12, which is illustrated as an n-channel MOSFET, is also responsive to the first read signal (rdca_b). That is, when the first read signal is at a high level transistor M12 turns on, and when the first read signal is at a low level transistor M12 turns off.

In FIG. 4, memory 400 is in a read standby state as the first and second read signals are in a high state (at a logical one '1') and the wordlines (wlc and wlt) are in a low state (i.e., at a logical zero '0'). In this case, bitlines 406 and 408 remain in a precharged state (i.e., at a logical one '1'), as bitlines 406 and 408 are not coupled to a cell that is in a low state. In FIG. 4, it is also assumed that the bitlines 'blc0a' and 'blc0b' remain in a precharged state (i.e., at a logical '1'). Given that the first and second read signals are in a high state (at a logical one '1') and bitlines 406, 408, 'blc0a' and 'blc0b' remain in a precharged state (as bitlines 406, 408, 'blc0a' and 'blc0b' are not coupled to a cell that can pull the bitlines down), transistors M1-M3 and M7-M9 are turned off (as indicated by the dashed boxes) and transistors M4-M6 and M10-M12 are turned on. As a gate of transistor M13 (which is illustrated as an n-channel MOSFET) is pulled to a low state by transistors M4-M6 and M10-M12, transistor M13 remains off and complementary global bit line (labeled 'glbc') remains in a precharged state (i.e., at a logical one '1'), as no bitline is selected.

Figure 5:
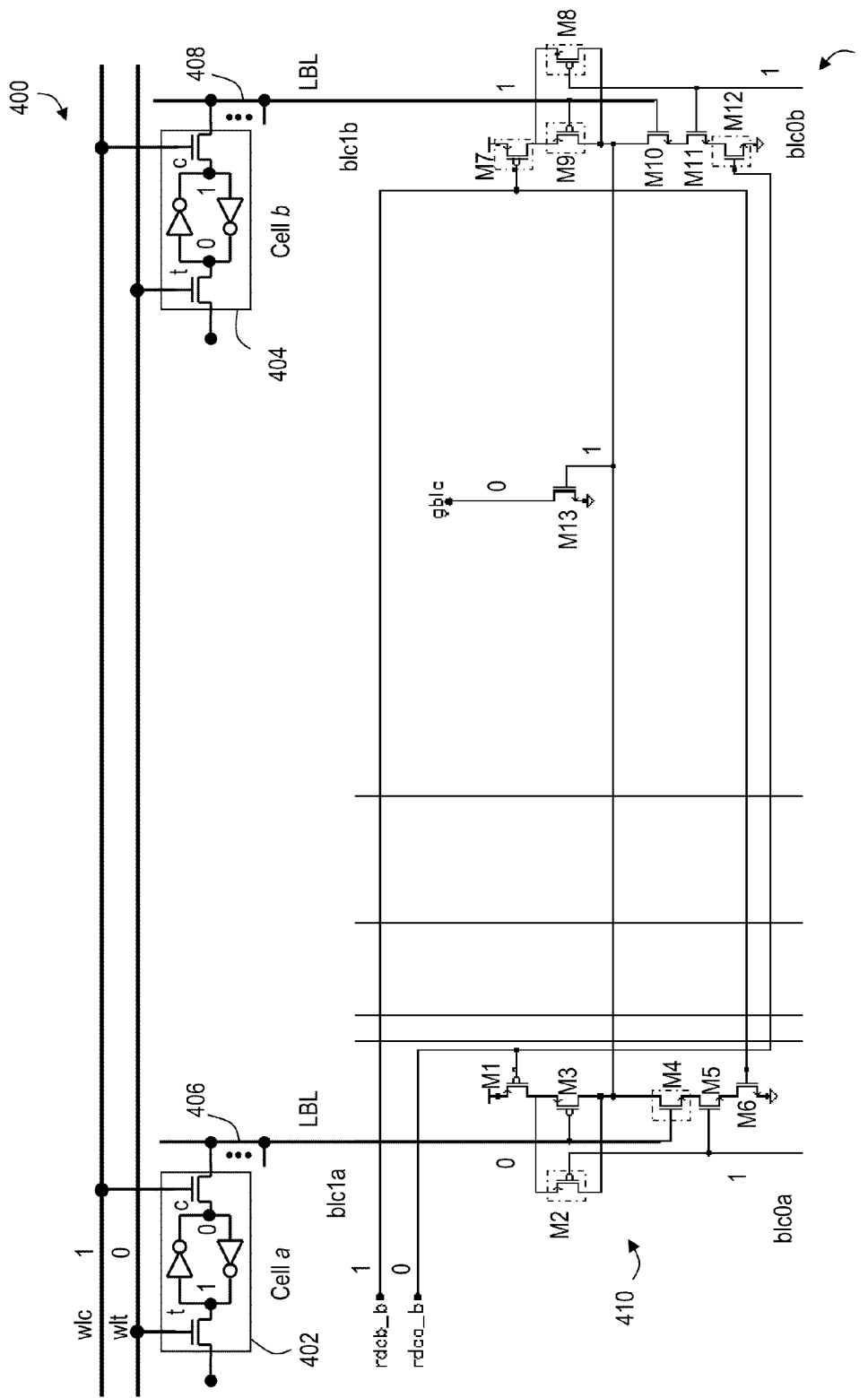
FIG. 5 is a diagram of a relevant portion of the local evaluation circuit of FIG. 4 in a read state, where evaluated cells 'a' and 'b' are in different states.

With reference to FIG. 5, memory 400 is further illustrated when complementary ports of cells 402 and 404 are coupled to bitlines 406 and 408, respectively. As is illustrated, cell 402 stores a logical one '1', and cell 404 stores a logical zero '0'. That is, a true side of cell 402 stores a logical one '1', a complementary side of cell 402 stores a logical zero '0', a true side of cell 404 stores a logical zero '0', and a complementary side of cell 404 stores a logical one '1'.

In FIG. 5, memory 400 is in a read evaluate state for cell 402, as the first read signal is in a low state (at a logical zero '0'), the second read signal is in a high state (at a logical one '1') and the complementary wordline (wlc) is in a high state (i.e., at a logical one '1'). In this case, bitline 406 is pulled to a low state (as the complementary value of cell 402 is at a logical zero '0'), and bitline 408 remains in a precharged state (i.e., at a logical one '1'), as cell 404 stores a logical one '1'. In FIG. 5, it is also assumed that the bitlines 'blc0a' and 'blc0b' remain in a precharged state (i.e., at a logical '1'). Given that the first read signal is in a low state (i.e. at a logical zero '0'), the second read signal is in a high state (at a logical one '1'), bitline 406 is pulled to a low state, and bitlines 408, 'blc0a' and 'blc0b' remain in a precharged state (as bitlines 408, 'blc0a' and 'blc0b' are not coupled to a cell that can pull the bitlines down), transistors M2, M4, M7-M9, and M12 are turned off or remain off (as indicated by the dashed boxes), and transistors M1, M3, M5, M6, M10, and M11 are turned on or remain on when transitioning from the read standby state to the read evaluate state. As a gate of transistor M13 (which is illustrated as an n-channel MOSFET) is driven with a logical one '1', as provided by transistors M1 and M3, transistor M13 turns on, transistor M13 pulls the complementary global bit line (labeled 'glbc') low to a logical zero '0', and bitline 406 is selected. It should be appreciated that there is no collision on the gate of transistor M13, as transistor M12 turns off.

Figure 6:
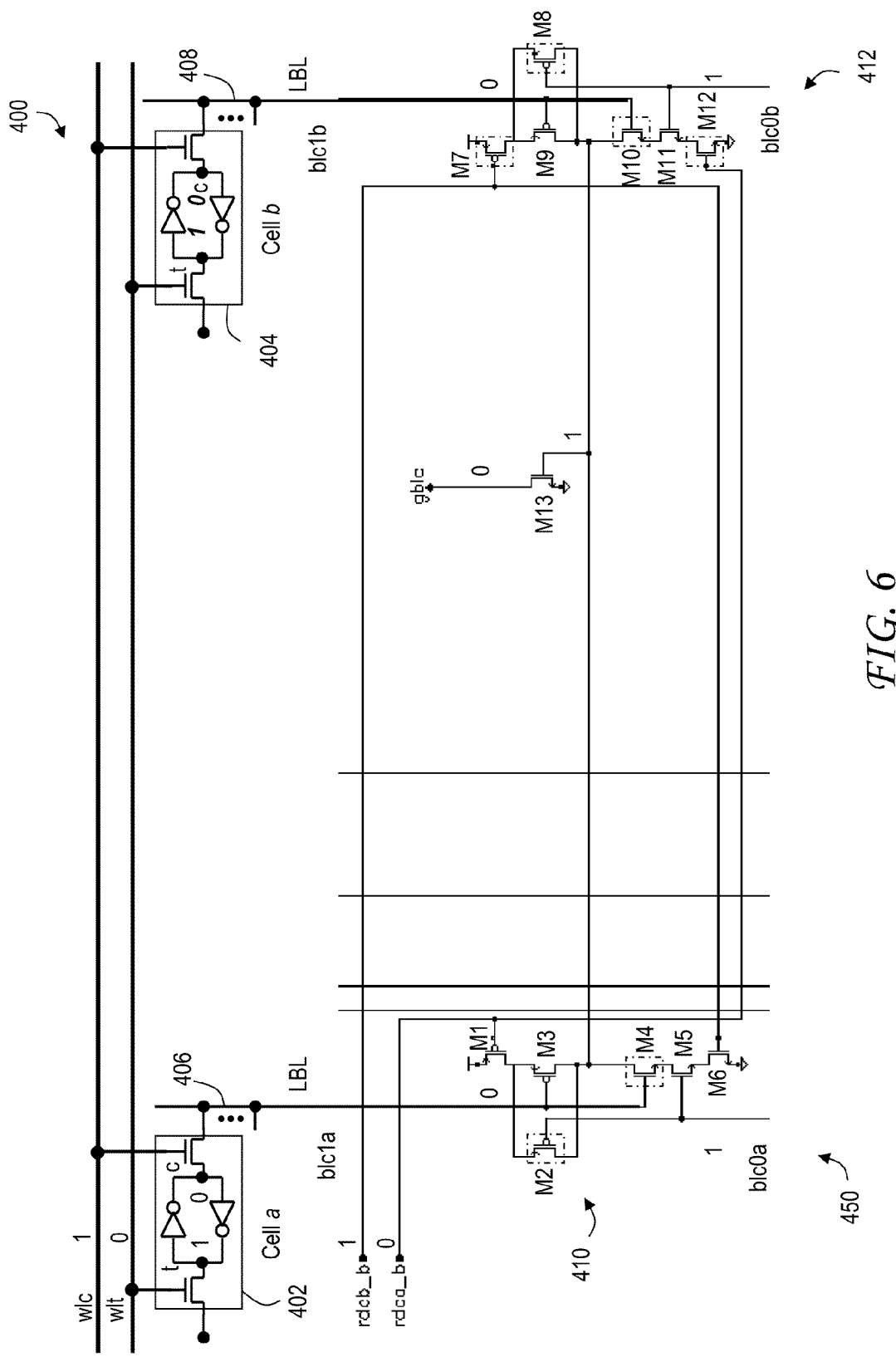
FIG. 6 is a diagram of a relevant portion of the local evaluation circuit of FIG. 4 in another read state, where evaluated cells 'a' and 'b' are in a same state.

With reference to FIG. 6, memory 400 is further illustrated when complementary ports of cells 402 and 404 are coupled to bitlines 406 and 408, respectively. As is illustrated, cell 402 stores a logical one '1', and cell 404 stores a logical one '1'. That is, a true side of cell 402 stores a logical one '1', a complementary side of cell 402 stores a logical zero '0', a true side of cell 404 stores a logical one '1', and a complementary side of cell 404 stores a logical zero '0'.

In FIG. 6, memory 400 is again in a read evaluate state for cell 402, as the first read signal is in a low state (at a logical zero '0'), the second read signal is in a high state (at a logical one '1'), and the complementary wordline (wlc) is in a high state (i.e., at a logical one '1'). In this case, bitline 406 is pulled to a low state (as the complementary value of cell 402 is at a logical zero '0'), and bitline 408 is also pulled to a low state (as the complementary value of cell 404 is at a logical zero '0'). In FIG. 6, it is also assumed that the bitlines 'blc0a' and 'blc0b' remain in a precharged state (i.e., at a logical '1'). Given that the first read signal is in a low state (i.e. at a logical zero '0'), the second read signal is in a high state (at a logical one '1'), bitlines 406 and 408 are pulled to a low state, and bitlines 'blc0a' and 'blc0b' remain in a precharged state (as bitlines 'blc0a' and 'blc0b' are not coupled to a cell that can pull the bitlines down), transistors M2, M4, M7, M8, M10, and M12 are turned off or remain off (as indicated by the dashed boxes), and transistors M1, M3, M5, M6, M8, and M11 are turned on or remain on when transitioning from the read standby state to the read evaluate state. As a gate of transistor M13 (which is illustrated as an n-channel MOSFET) is driven with a logical one '1', as provided by transistors M1 and M3, transistor M13 turns on, transistor M13 pulls the complementary global bit line (labeled 'glbc') low to a logical zero '0', and bitline 406 is selected. It should be appreciated that there is no collision on the gate of transistor M13, as transistor M12 turns off.

Figure 7:
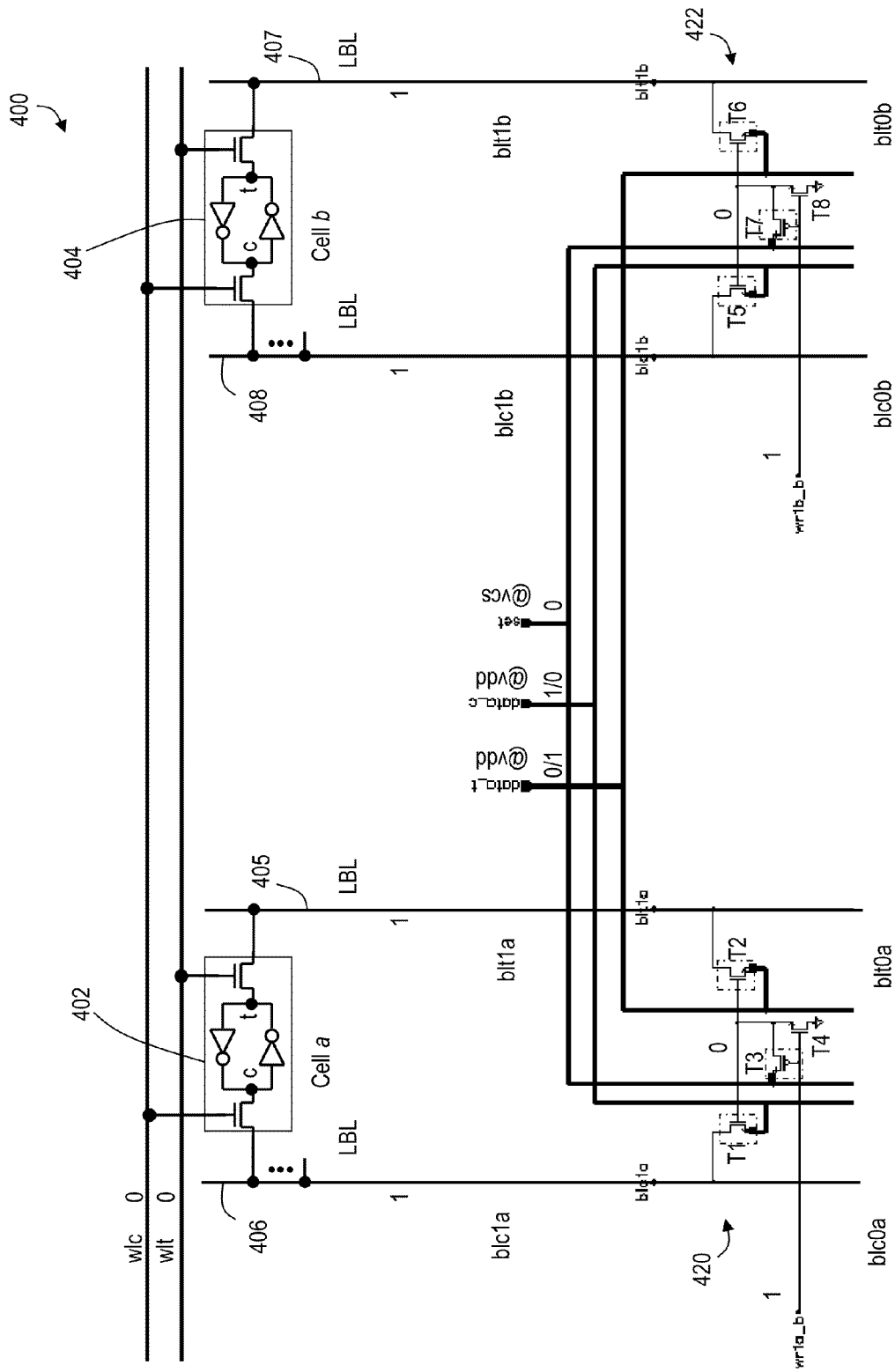
FIG. 7 is a diagram of a relevant portion of a local evaluation circuit that is in a write standby state and is configured in accordance with an embodiment of the present disclosure to write a cell.

With reference to FIG. 7 a relevant portion of a memory 400 is illustrated that includes multiple memory cells 402 and 404 (respectively, labeled 'Cell a' and 'Cell b') in row '1' of memory 400 and a write portion (i.e., circuits 420 and 422) of local evaluation circuit 450, which includes transistors (switches) T1-T8 coupled as illustrated. Memory cells 402 and 404 are located in a different columns (i.e., column 'a' and 'b', respectively of a same row (i.e., row '1')) of memory 400 and are coupled to respective local bitlines based on signals on true and complementary wordlines (respectively, labeled "wlt" and "wlc"). That is, an asserted signal on complementary wordline 'wlc' couples a complementary side 'c' of cell 402 to complementary local bitline 406 and a complementary side 'c' of cell 404 to complementary local bitline 408. Similarly, an asserted signal on wordline 'wlt' couples a true T side of cell 402 to a true local bitline 405 and a true T side of cell 404 to another true local bitline 407. While only two columns (i.e., columns 'a' and 'b') are illustrated in memory 400, it should be appreciated that a memory configured according to the present disclosure may include more than two columns.

As is shown, a true side 't' of memory cell 402 is coupled to a local bitline 405 (labeled "blt1a"), and a complementary side 'c' of memory cell 402 is coupled to a local bitline 406 (labeled "blc1a"). Similarly, a true side 't' of memory cell 404 is coupled to a local bitline 407 (labeled "blt1b"), and a complementary side 'c' of and memory cell 404 is coupled to a local bitline 408 (labeled "blc1b"). It should be appreciated that local bitlines 405 and 406 may be coupled to multiple memory cells (e.g., sixteen memory cells) of a first cluster in different rows of a same column (i.e., column 'a') as cell 402. Similarly, local bitlines 407 and 408 may be coupled to multiple memory cells (e.g., sixteen memory cells) of a second cluster in different rows of a same column (i.e., column 'b') as cell 404.

Local bitline 406 is coupled to a drain of transistor T1, and local bitline 405 is coupled to a drain of transistor T2. A gate of transistors T1 and T2 is coupled to a drain of transistor T3 and a source of transistor T4. A source of transistor T1 is coupled to a data complement signal (data_c), a source of transistor T2 is coupled to a data true signal (data_t), and a source of transistor T3 is coupled to a set signal. A first write signal (wr1a_b) is coupled to a gate of transistor T3 and a gate of transistor T4. A drain of transistor T4 is coupled to VSS. Similarly, local bitline 408 is coupled to a drain of transistor T5 and local bitline 407 is coupled to a drain of transistor T6. A gate of transistors T5 and T6 is coupled to a drain of transistor T7 and a source of transistor T8. A source of transistor T5 is coupled to the data complement signal (data_c), a source of transistor T6 is coupled to the data true signal (data_t), and a source of transistor T7 is coupled to the set signal. A second write signal (wr1b_b) is coupled to a gate of transistor T7 and a gate of transistor T8. A drain of transistor T8 is coupled to VSS.

As shown, transistors T1-T8 are metal-oxide semiconductor field-effect transistors (MOSFETs). As is shown, transistors T3 and T7 are p-channel MOSFETs, and transistors T1, T2, T4-T6, and T8 are n-channel MOSFETs. Transistors T3 and T4 are responsive to the first write signal, which when asserted low writes values on data true and complement lines to cell 402. That is, when the first write signal is at a low level transistor T3 turns on and transistor T4 turns off, and when the first write signal is at a high level transistor T3 turns off and transistor T4 turns on, depending on the voltage levels at the sources and drains of transistors T3 and T4. Similarly, transistors T7 and T8 are responsive to a second write signal, which when asserted low writes values on data true and complement lines to cell 404. That is, when the second write signal is at a low level transistor T7 turns on and transistor T8 turns off, and when the second write signal is at a high level transistor T7 turns off and transistor T8 turns on, depending on the voltage levels at the sources and drains of transistors T7 and T8.

In FIG. 7, memory 400 is in a write standby state as the first and second write signals are in a high state (at a logical one '1') and the wordlines (wlc and wlt) are in a low state (i.e., at a logical zero '0'). In this case, bitlines 405-408 remain in a precharged state (i.e., at a logical one '1'), as bitlines 405-408 are not coupled to data true, data complement, or set lines (as transistors T1-T6 are turned off and transistors T4 and T8 are turned on).

Figure 8:
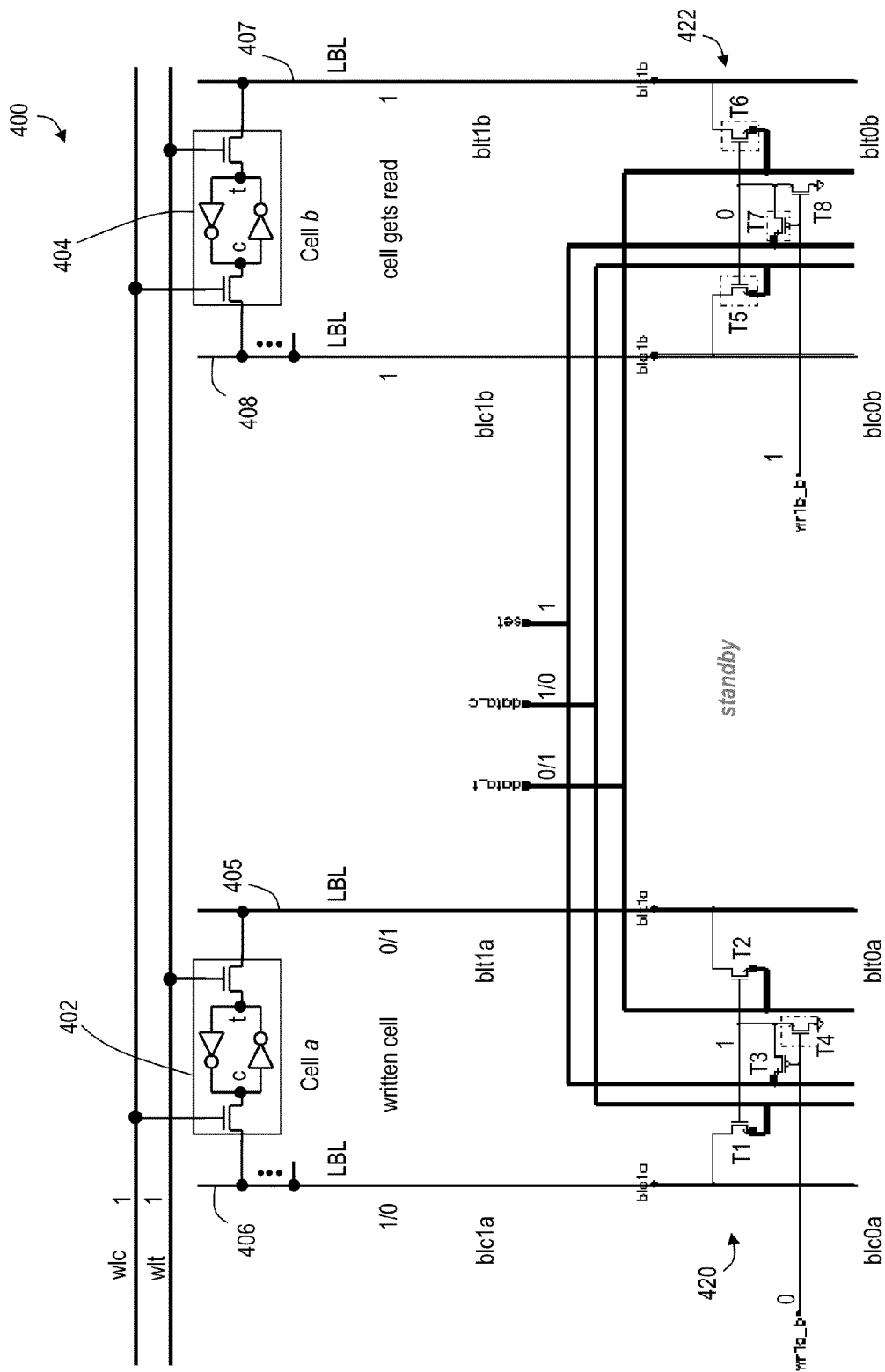
FIG. 8 is a diagram of a relevant portion of the local evaluation circuit of FIG. 7 in a write state.

With reference to FIG. 8, memory 400 is in a write evaluate state, where data on data true and data complement lines is written to a selected one of cells 402 and 404. In FIG. 8, cell 402 is selected, as the first write signal is at a logical zero '0' state. In this case, transistor T4 turns off, and transistors T1-T3 turn on. As the second write signal is in a logical one '1' state, transistor T7 remains off and transistor T8 remains on, which holds the gates of transistors T5 and T6 at a logical zero '0' state (keeping transistors T5 and T6 off). As the data true signal transitions from a logical zero '0' to a logical one '1' and the data complement signal transitions from a logical one '1' to a logical zero '0', cell 402 is written with a logical one '1' responsive to the set signal being at a logical one '1'. Simultaneously, cell 404 gets read.

Accordingly, a local evaluation circuit has been disclosed herein that advantageously evaluate bitlines in a manner that generally reduces memory latency, as compared to conventional local evaluation circuits.

In some implementations, certain steps of the methods may be combined, performed simultaneously or in a different order, or perhaps omitted, without deviating from the spirit and scope of the invention. Thus, while the method steps are described and illustrated in a particular sequence, use of a specific sequence of steps is not meant to imply any limitations on the invention. Changes may be made with regards to the sequence of steps without departing from the spirit or scope of the present invention. Use of a particular sequence is therefore, not to be taken in a limiting sense, and the scope of the present invention is defined only by the appended claims.

As will be appreciated by one skilled in the art, aspects of the present invention may be embodied as a system, method or computer program product (e.g., in the form of design files). Accordingly, aspects of the present invention may take the form of an entirely hardware embodiment or an embodiment combining software and hardware aspects that may all generally be referred to herein as a "circuit," "module" or "system." Furthermore, aspects of the present invention may take the form of a computer program product embodied in one or more computer-readable medium(s) having computer-readable program code embodied thereon.

Any combination of one or more computer-readable medium(s) may be utilized. The computer-readable medium may be a computer-readable signal medium or a computer-readable storage medium. A computer-readable storage medium may be, for example, but not limited to, an electronic, magnetic, optical, electromagnetic, infrared, or semiconductor system, apparatus, or device, or any suitable combination of the foregoing, but does not include a computer-readable signal medium. More specific examples (a non-exhaustive list) of the computer-readable storage medium would include the following: a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer-readable storage medium may be any tangible storage medium that can contain, or store a program for use by or in connection with an instruction execution system, apparatus, or device.

A computer-readable signal medium may include a propagated data signal with computer-readable program code embodied therein, for example, in baseband or as part of a carrier wave. Such a propagated signal may take any of a variety of forms, including, but not limited to, electro-magnetic, optical, or any suitable combination thereof. A computer-readable signal medium may be any computer-readable medium that is not a computer-readable storage medium and that can communicate, propagate, or transport a program for use by or in connection with an instruction execution system, apparatus, or device. Program code embodied on a computer-readable signal medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described herein with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

The computer program instructions may also be stored in a computer-readable storage medium that can direct a computer, other programmable data processing apparatus, or other devices to function in a particular manner, such that the instructions stored in the computer-readable medium produce an article of manufacture including instructions which implement the function/act specified in the flowchart and/or block diagram block or blocks. The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

As will be further appreciated, the processes in embodiments of the present invention may be implemented using any combination of software, firmware or hardware. As a preparatory step to practicing the invention in software, the programming code (whether software or firmware) will typically be stored in one or more machine readable storage mediums such as fixed (hard) drives, diskettes, optical disks, magnetic tape, semiconductor memories such as ROMs, PROMs, etc., thereby making an article of manufacture in accordance with the invention. The article of manufacture containing the programming code is used by either executing the code directly from the storage device, by copying the code from the storage device into another storage device such as a hard disk, RAM, etc., or by transmitting the code for remote execution using transmission type media such as digital and analog communication links. The methods of the invention may be practiced by combining one or more machine-readable storage devices containing the code according to the present invention with appropriate processing hardware to execute the code contained therein. An apparatus for practicing the invention could be one or more processing devices and storage subsystems containing or having network access to program(s) coded in accordance with the invention.

Thus, it is important that while an illustrative embodiment of the present invention is described in the context of a fully functional computer (server) system with installed (or executed) software, those skilled in the art will appreciate that the software aspects of an illustrative embodiment of the present invention are capable of being distributed as a program product in a variety of forms, and that an illustrative embodiment of the present invention applies equally regardless of the particular type of media used to actually carry out the distribution.

While the invention has been described with reference to exemplary embodiments, it will be understood by those skilled in the art that various changes may be made and equivalents may be substituted for elements thereof without departing from the scope of the invention. In addition, many modifications may be made to adapt a particular system, device or component thereof to the teachings of the invention without departing from the essential scope thereof. Therefore, it is intended that the invention not be limited to the particular embodiments disclosed for carrying out this invention, but that the invention will include all embodiments falling within the scope of the appended claims. Moreover, the use of the terms first, second, etc. do not denote any order or importance, but rather the terms first, second, etc. are used to distinguish one element from another.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. A local evaluation circuit for a memory array, comprising:
    a first NAND gate having a first input, a second input, and an output, wherein a first local bit line of a first column of the memory array is coupled to the first input of the first NAND gate, a second local bit line of the first column is coupled to the second input of the first NAND gate, and the output of the first NAND gate is coupled to a global bit line, and wherein the first column of the memory array includes a plurality of memory cells and the first and second local bit lines are coupled to different clusters of the memory cells in the first column;
    a second NAND gate having a first input, a second input, and an output, wherein a third local bit line of a second column of the memory array is coupled to the first input of the second NAND gate, a fourth local bit line of the second column is coupled to the second input of the second NAND gate, and the output of the second NAND gate is coupled to the global bit line, and wherein the second column of the memory array includes a plurality of memory cells and the third and fourth local bit lines are coupled to different clusters of the memory cells in the second column;
    a first switch configured to couple a first node of the second NAND gate to a first power supply node in response to a first read signal;
    a second switch configured to couple a first node of the first NAND gate to the first power supply node in response to a second read signal;
    a third switch configured to couple a second node of the first NAND gate to a second power supply node in response to the first read signal; and
    a fourth switch configured to couple a second node of the second NAND gate to the second power supply node in response to the second read signal.

2. The local evaluation circuit of claim 1, wherein the first and second switches are re-channel field-effect transistors and the third and fourth switches are p-channel field-effect transistors.

3. The local evaluation circuit of claim 1, wherein the first power supply node corresponds to a low voltage node and the second power supply node corresponds to a high voltage node.

4. The local evaluation circuit of claim 1, wherein in response to the first and second read signals being unasserted, the global bit line remains in an asserted state.

5. The local evaluation circuit of claim 1, wherein in response to one of the first and second read signals being unasserted, the global bit line is pulled to an unasserted state.

6. The local evaluation circuit of claim 1, wherein each of the clusters includes sixteen memory cells.

7. The local evaluation circuit of claim 1, wherein the first and second NAND gates each include two p-channel field-effect transistors and two n-channel field-effect transistors.

8. A data processing system, comprising:
    a processor; and
    a memory array coupled to the processor, the memory array including a local evaluation circuit, the local evaluation circuit comprising:
        a first NAND gate having a first input, a second input, and an output, wherein a first local bit line of a first column of the memory array is coupled to the first input of the first NAND gate, a second local bit line of the first column is coupled to the second input of the first NAND gate, and the output of the first NAND gate is coupled to a global bit line, and wherein the first column of the memory array includes a plurality of memory cells and the first and second local bit lines are coupled to different clusters of the memory cells in the first column;
        a second NAND gate having a first input, a second input, and an output, wherein a third local bit line of a second column of the memory array is coupled to the first input of the second NAND gate, a fourth local bit line of the second column is coupled to the second input of the second NAND gate, and the output of the second NAND gate is coupled to the global bit line, and wherein the second column of the memory array includes a plurality of memory cells and the third and fourth local bit lines are coupled to different clusters of the memory cells in the second column;
        a first switch configured to couple a first node of the second NAND gate to a first power supply node in response to a first read signal;
        a second switch configured to couple a first node of the first NAND gate to the first power supply node in response to a second read signal;
        a third switch configured to couple a second node of the first NAND gate to a second power supply node in response to the first read signal; and
        a fourth switch configured to couple a second node of the second NAND gate to the second power supply node in response to the second read signal.

9. The data processing system of claim 8, wherein the first and second switches are re-channel field-effect transistors and the third and fourth switches are p-channel field-effect transistors.

10. The data processing system of claim 8, wherein the first power supply node corresponds to a low voltage node and the second power supply node corresponds to a high voltage node.

11. The data processing system of claim 8, wherein in response to the first and second read signals being unasserted, the global bit line remains in an asserted state.

12. The data processing system of claim 8, wherein in response to one of the first and second read signals being unasserted, the global bit line is pulled to an unasserted state.

13. The data processing system of claim 8, wherein each of the clusters includes sixteen memory cells.

14. The data processing system of claim 8, wherein the first and second NAND gates each include two p-channel field-effect transistors and two n-channel field-effect transistors.

15. A memory, comprising:
a memory array; and
a local evaluation circuit, comprising:
    a first NAND gate having a first input, a second input, and an output, wherein a first local bit line of a first column of the memory array is coupled to the first input of the first NAND gate, a second local bit line of the first column is coupled to the second input of the first NAND gate, and the output of the first NAND gate is coupled to a global bit line, and wherein the first column of the memory array includes a plurality of memory cells and the first and second local bit lines are coupled to different clusters of the memory cells in the first column;
    a second NAND gate having a first input, a second input, and an output, wherein a third local bit line of a second column of the memory array is coupled to the first input of the second NAND gate, a fourth local bit line of the second column is coupled to the second input of the second NAND gate, and the output of the second NAND gate is coupled to the global bit line, and wherein the second column of the memory array includes a plurality of memory cells and the third and fourth local bit lines are coupled to different clusters of the memory cells in the second column;
    a first switch configured to couple a first node of the second NAND gate to a first power supply node in response to a first read signal;
    a second switch configured to couple a first node of the first NAND gate to the first power supply node in response to a second read signal;
    a third switch configured to couple a second node of the first NAND gate to a second power supply node in response to the first read signal; and
    a fourth switch configured to couple a second node of the second NAND gate to the second power supply node in response to the second read signal.

16. The memory of claim 15, wherein the first and second switches are n-channel field-effect transistors and the third and fourth switches are p-channel field-effect transistors.

17. The memory of claim 15, wherein the first power supply node corresponds to a low voltage node and the second power supply node corresponds to a high voltage node.

18. The memory of claim 15, wherein in response to the first and second read signals being unasserted, the global bit line remains in an asserted state.

19. The memory of claim 15, wherein in response to one of the first and second read signals being unasserted, the global bit line is pulled to an unasserted state.

20. The memory of claim 15, wherein each of the clusters includes sixteen memory cells.

\* \* \* \* \*